United States Patent
Subramanian et al.

(10) Patent No.: US 6,686,270 B1
(45) Date of Patent: Feb. 3, 2004

(54) DUAL DAMASCENE TRENCH DEPTH MONITORING

(75) Inventors: Ramkumar Subramanian, Sunnyvale, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/212,983

(22) Filed: Aug. 5, 2002

(51) Int. Cl.$^7$ .......................................... H01L 21/4763
(52) U.S. Cl. ...................... 438/629; 438/633; 438/637; 438/638; 438/672
(58) Field of Search ................................ 438/629, 633, 438/637, 638, 672

(56) References Cited

U.S. PATENT DOCUMENTS

| | | | |
|---|---|---|---|
| 5,926,732 A | * | 7/1999 | Matsuura .................... 438/622 |
| 6,545,753 B2 | * | 4/2003 | Subramanian et al. ... 356/237.5 |
| 2003/0000922 A1 | * | 1/2003 | Subramanian et al. ........ 216/60 |
| 2003/0052084 A1 | * | 3/2003 | Tabery et al. ................. 216/59 |

OTHER PUBLICATIONS

Niu, X., et al., "Specular Spectroscopic Scatterometry in DUV Lithography," Timbre Technology, Inc., et al.
Smith, T., et al., "Process Control in the Semiconductor Industry," http://www-mtl.mit.edu/taber/Research/Process_Control/IERC99/ pp1-24.
Cote, D.R., et al., "Plasma-assisted chemical vapor deposition of dielectric thin films for ULSI semiconductor circuits," IBM Journal of Reseach & Development, vol. 43, No. ½ pp 1-30.

* cited by examiner

Primary Examiner—W. David Coleman
Assistant Examiner—Hsien Ming Lee
(74) Attorney, Agent, or Firm—Amin & Turocy, LLP

(57) ABSTRACT

One aspect of the present invention relates to a method of dual damascene processing, involving forming a plurality of via openings in the insulation structure containing a single layer of a dielectric material; and simultaneously (i) forming a plurality of trenches in the insulation structure, each trench positioned along the substantially straight line of a group of via openings, and (ii) monitoring the formation of trenches using a scatterometry system to determine trench depth, and terminating forming the trenches when a desired trench depth is attained.

20 Claims, 15 Drawing Sheets

DUAL DAMASCENE TRENCH DEPTH MONITORING

TECHNICAL FIELD

The present invention generally relates to forming dual damascene structures in semiconductor substrates. In particular, the present invention relates to efficiently forming dual damascene structures in a single layer of insulation material without the need for a trench etch stop layer.

BACKGROUND ART

Conventional semiconductor devices typically comprise a semiconductor substrate and a plurality of dielectric and conductive layers formed thereon. An integrated circuit contains numerous microelectronic devices, such as metal oxide semiconductor field effect transistors (MOSFETs), a plurality of conductive patterns comprising conductive lines separated by interwiring spacings, and a plurality of interconnect lines, such as bus lines, bit lines, word lines and logic interconnect lines. Such interconnection lines, made of metal interconnect materials, generally constitute a limiting factor in terms of size (width) and various functional characteristics of the integrated circuit. As such, there exists a need to efficiently provide a reliable interconnection structure having a small size yet capable of achieving higher operating speeds, improved signal-to-noise ratio and improved reliability.

Using a dual damascene process, semiconductor devices are patterned with several thousand openings for conductive lines and vias which are filled with a conductive metal, such as aluminum or copper, and serve to interconnect the active and/or passive elements of the integrated circuit. The dual damascene process also is used for forming the multilevel signal lines of conductive metal in the insulating layers of multilayer substrate on which semiconductor devices are mounted.

Damascene (single damascene) is an interconnection fabrication process in which grooves are formed in an insulating structure and filled with metal to form the conductive lines. Dual damascene is a multi-level interconnection process in which, in addition to forming the grooves of single damascene, the conductive via openings also are formed.

In the standard dual damascene process, a first mask with the image pattern of the via openings is formed over the insulating structure and the wafer is anisotropically etched in the upper portion of the insulating structure (via etch). After removal of the patterned resist material, a second mask is formed over the insulating structure with the image pattern of the conductive lines in alignment with the via openings. In anisotropically etching the openings for the conductive lines in the upper half of the insulating material, the via openings already present in the upper half are simultaneously etched in the lower half of the insulating material (trench etch). After the etching is complete, both the vias and grooves are filled with metal. This process is illustrated in FIG. 1.

In another standard dual damascene process, a first mask is formed over the insulating structure with the image pattern of the via openings and the pattern is anisotropically etched in the insulating structure (via etch). After removal of the patterned resist material, a second mask is formed over the insulating structure with the image pattern of the conductive lines in alignment with the via openings and the pattern of the conductive lines is anisotropically etched (trench etch). After the etching is complete, both the vias and grooves are filled with metal. This process is illustrated in FIG. 2.

Dual damascene is an improvement over single damascene because it permits the filling of both the conductive grooves and vias with metal at the same time, thereby eliminating process steps. Although standard dual damascene offers advantages over other processes for forming interconnections, it has a number of disadvantages. For example, the insulating structure through which vias and trenches are formed is typically comprised of three layers; namely, relatively thick lower and an upper insulating layers of a first material sandwiching a relatively thin insulating layer of a second material where there is etch selectivity between the first material and the second material. The relatively thin insulating layer is also known as the trench etch stop layer. The presence of the relatively thin insulating layer thus improves the ability to accurately and precisely terminate the trench etch so that the depths of the trenches correspond with the desired depth.

The use of multilayered insulating structures complicates processing due to the requirement of forming multiple layers of precise thickness. However, in the absence of the trench etch stop layer, performing the trench etch leads to trenches that are too shallow or too deep, and poor uniformity across the wafer (such as trenches that are too shallow in regions near the edges of the wafer and trenches that are too deep in the center of the wafer). Moreover, trench etch performance varies from wafer to wafer.

SUMMARY OF THE INVENTION

The present invention provides systems and methods for improving dual damascene processes by eliminating the requirement of using a trench etch stop layer. In this connection, the systems and methods for employing dual damascene processes employ a single layer insulating structure that is simple to fabricate. The systems and methods employ the use of a monitoring system capable of monitoring trench etch depth and profile over the entire wafer during the etch trench process, thereby enabling an operator to accurately terminate the trench etch process.

One aspect of the present invention relates to a method of dual damascene processing involving forming a plurality of via openings in the insulation structure containing a single layer of a dielectric material, wherein groups of via openings are positioned in a substantially straight line; and simultaneously (i) forming a plurality of trenches in the insulation structure, each trench positioned along the substantially straight line of a group of via openings, and (ii) monitoring the formation of trenches using a scatterometry system by generating a signature associated with forming the trenches, comparing the signature to a signature library to determine trench depth, and terminating forming the trenches when a desired trench depth is attained.

Another aspect of the present invention relates to a method of forming a dual damascene opening in a semiconductor substrate involving providing a semiconductor substrate with an insulation structure on an upper surface thereof, the insulation structure containing a single layer of a dielectric material; forming at least one via opening in the insulation structure; and simultaneously (i) forming a trench in the insulation structure, the trench positioned above the via opening, both the via opening and the trench constituting the dual damascene opening, and (ii) monitoring forming the trench using a scatterometry system by: directing a beam of incident light at the insulation structure, collecting light reflected from the insulation structure, transforming the reflected light into a signature associated with forming the trench, comparing the signature to a signature library to determine trench depth, and terminating forming the trench when a desired trench depth is attained.

Yet another aspect of the present invention relates to a method of forming a dual damascene structure involving forming a plurality of via openings in the insulation structure containing a single layer of a dielectric material, wherein groups of via openings are positioned in a substantially straight line; simultaneously (i) forming a plurality of trenches in the insulation structure using a trench etch controller, each trench positioned along the substantially straight line of a group of via openings, and (ii) monitoring the formation of trenches using a scatterometry system by generating a signature associated with forming the trenches, comparing the signature to a signature library to determine trench depth, and if the determine trench depth is not within an acceptable range of desired trench depths, instructing the trench etch controller to continue forming the trenches and optionally adjust a trench etch process component; and if the determine trench depth is within an acceptable range of desired trench depths, instructing the trench etch controller to terminate forming the trenches.

DISCLOSURE OF INVENTION

Figure 1:
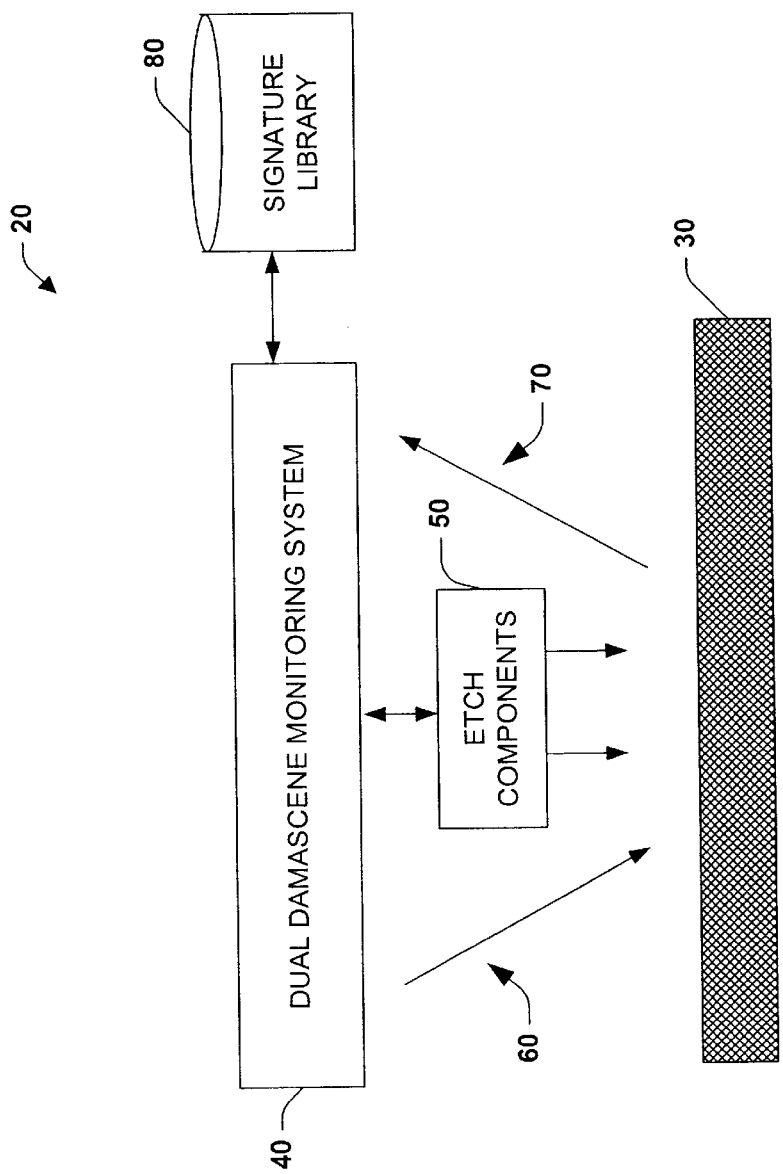
FIG. 1 illustrates a high-level schematic diagram of a system according to one aspect of the present invention.

The present invention involves improving the efficiency when performing a dual damascene process by eliminating the necessity of employing a trench etch stop layer in the insulating structure through which the dual damascene is formed. The present invention involves forming dual damascene openings (via and trench) in a single layer of dielectric or insulating material. That is, the insulating structure through which the dual damascene opening is formed consists essentially of one layer, and does not include multiple layers. As a result, the efficiency of dual damascene processing is improved since the formation of multiple layers of dielectric materials to make an insulating structure through which dual damascene openings are formed is eliminated.

Referring to FIGS. 13 to 16, a dual damascene process in accordance with one embodiment of the present invention is shown. Specifically referring to FIG. 13, a semiconductor substrate 500 is provided with an insulating structure 502 containing a single layer of dielectric or insulating material on the upper surface thereof. The term substrate includes not only a semiconductor substrate, such as semiconductor substrate 500, but also any and all layers and structures fabricated over the semiconductor substrate up to the point of processing under discussion. Semiconductor substrate 500 may include one or more structures such as active elements and passive elements including polysilicon gates, wordlines, source regions, drain regions, bit lines, bases, emitters, collectors, conductive lines, conductive plugs, diffusion regions, etc.

Dielectric or insulating material include silicon based dielectric materials, silicates, and low k material. Silicon based dielectric materials include silicon dioxide, silicon nitride and silicon oxynitride. Silicates include fluorine doped silicon glass (FSG), tetraethylorthosilicate (TEOS), borophosphotetraethylorthosilicate (BPTEOS), phosphosilicate glass (PSG), borophosphosilicate glass (BPSG), any other suitable spin-on glass.

Low k polymer materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and VeloxTM PAE-2 from Schumacher.

In one embodiment, the thickness of the insulating structure 502 is about 2,000 Å or more and about 30,000 Å or less. In another embodiment, the thickness of the insulating structure 502 is about 50,000 Å or more and about 20,000 Å or less.

A patterned resist 504 is formed over the upper surface of the insulating structure 502. The patterned resist 504 has an opening 506 corresponding to the subsequent opening of a via, exposing a portion of the insulating structure. The exposed portion of the insulating structure 502 is removed as the entire structure is subjected to an etching process. The particular etchant and etching conditions are selected based on the identity of the insulating structure 502. Aniosotropic etching or isotropic etching may be employed, but aniosotropic etching is preferred.

Figure 14:
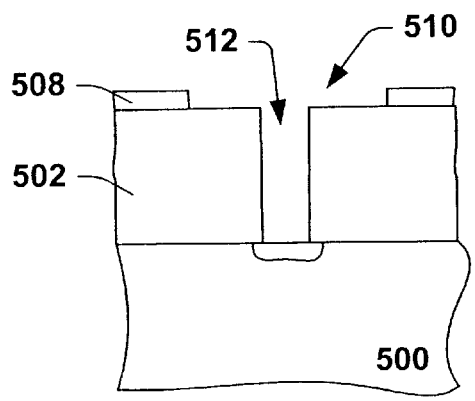

Referring to FIG. 14, the etched via 512 extends through the insulating structure 502. The width of via 512 may be as about 0.25 μm or less, about 0.18 μm or less, about 0.15 μm or less, about 0.12 μm or less, and even about 0.1 μm or less.

Another patterned resist 508 is formed over the insulating structure 502, the patterned resist 508 containing openings 510 corresponding to subsequently formed trenches.

Figure 15:
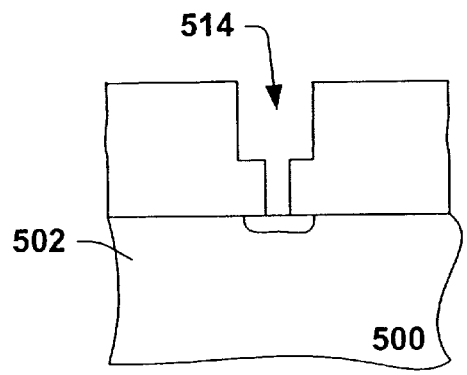

Referring to FIG. 15, simultaneously trenches are formed by etching while using scatterometry to monitor the formation of the trenches. The scatterometry operation is described more fully below. The scatterometry monitor permits the accurate detection of the trench depth end point without the need for a trench etch stop layer in the insulating structure 502. In this connection, when the desired trench depth is achieved (which depends upon the thickness of the insulating structure 502), the scatterometry monitor signals the etching process to terminate.

The particular etchant and etching conditions are selected based on the identity of the insulating structure 502, and the same or different etchant may be used in relation to etching the via 512, although conditions may be altered by the monitoring system. Aniosotropic etching or isotropic etching may be employed, but aniosotropic etching is preferred. The trenches combined with the previously formed vias constitute dual damascene openings 514. The width and depth of the trench portion of the dual damascene opening 514 may individually be about 0.35 $\mu$m or less, 0.25 $\mu$m or less, about 0.18 $\mu$m or less, about 0.15 $\mu$m or less, about 0.12 $\mu$m or less, and even about 0.1 $\mu$m or less.

Figure 16:
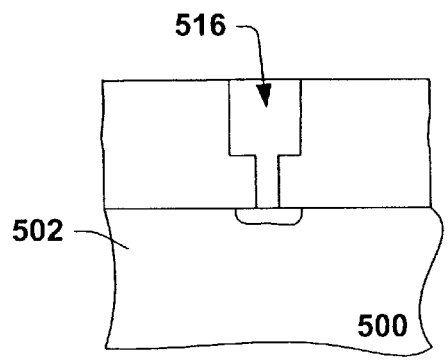
Figure 17:
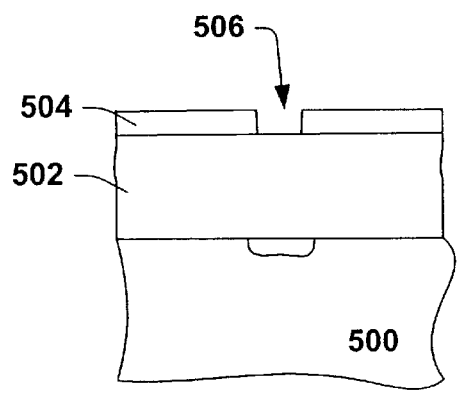
FIGS. 17–20 illustrate a dual damascene process according to another aspect of the present invention.

Referring to FIG. 16, conductive material 516 is deposited in the dual damascene openings 514. For example, conductive material may be deposited over the entire structure, followed by chemical mechanical polishing (CMP) to planarize the structure. Suitable conductive materials include copper, tungsten, gold, silver, aluminum, any alloys and/or combinations thereof. A barrier layer (not shown) may be optionally formed within the dual damascene openings 514 prior to depositing the conductive material.

Referring to FIGS. 17 to 20, a dual damascene process in accordance with one embodiment of the present invention is shown. Specifically referring to FIG. 17, a semiconductor substrate 500 is provided with an insulating structure 502 containing a single layer of dielectric or insulating material on the upper surface thereof. Dielectric or insulating material include silicon based dielectric materials, silicates, and low k material. In one embodiment, the thickness of the insulating structure 502 is about 2,000 Å or more and about 30,000 Å or less. In another embodiment, the thickness of the insulating structure 502 is about 50,000 Å or more and about 20,000 Å or less.

A patterned resist 504 is formed over the upper surface of the insulating structure 502. The patterned resist 504 has an opening 506 corresponding to the subsequent opening of a via, exposing a portion of the insulating structure. The exposed portion of the insulating structure 502 is removed as the entire structure is subjected to an etching process. The particular etchant and etching conditions are selected based on the identity of the insulating structure 502.

Figure 18:
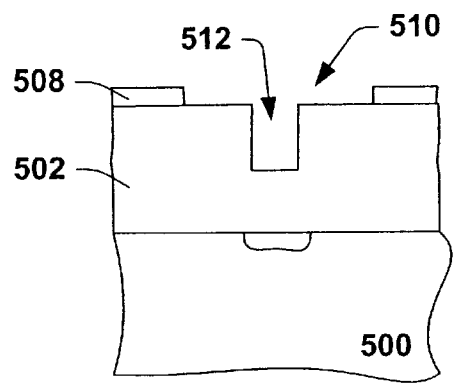

Referring to FIG. 18, the etched via 512 partially extends through the insulating structure 502. The width of via 512 may be as about 0.25 Å m or less. Another patterned resist 508 is formed over the insulating structure 502, the patterned resist 508 containing openings 510 corresponding to subsequently formed trenches.

Figure 19:
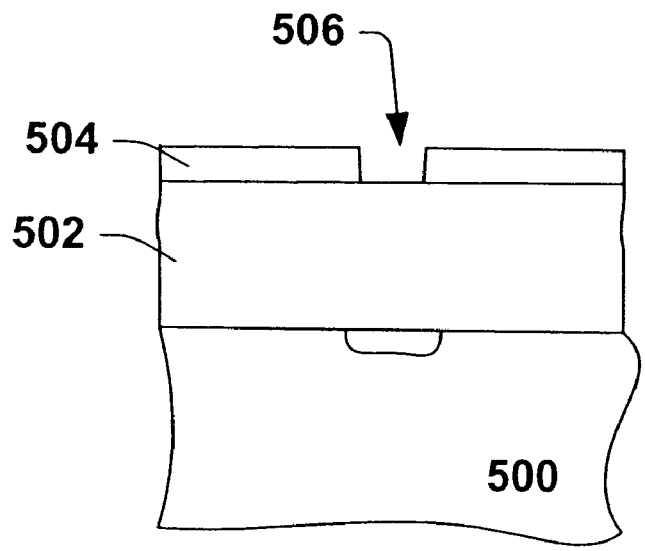

Referring to FIG. 19, simultaneously trenches are formed (and the vias are fully formed) by etching while using scatterometry to monitor the formation of the trenches. The scatterometry operation is described more fully below. The scatterometry monitor permits the accurate detection of the trench depth end point without the need for a trench etch stop layer in the insulating structure 502 (as well as the via end point). In this connection, when the desired trench depth is achieved (which depends upon the thickness of the insulating structure 502), the scatterometry monitor signals the etching process to terminate.

The particular etchant and etching conditions are selected based on the identity of the insulating structure 502, and the same or different etchant may be used in relation to etching the via 512, although conditions may be altered by the monitoring system. The trenches combined with the vias constitute dual damascene openings 514. The width and depth of the trench portion of the dual damascene opening 514 may individually be about 0.35 $\mu$m or less.

Figure 20:
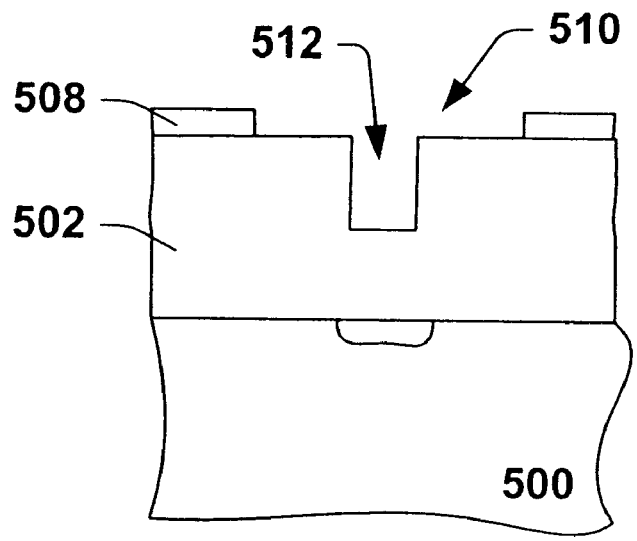

Referring to FIG. 20, conductive material 516 is deposited in the dual damascene openings 514. For example, conductive material may be deposited over the entire structure, followed by CMP to planarize the structure. Suitable conductive materials include copper, tungsten, gold, silver, aluminum, any alloys and/or combinations thereof. A barrier layer (not shown) may be optionally formed within the dual damascene openings 514 prior to depositing the conductive material.

Monitoring the subject wafer as it proceeds through the trench etch process effectively allows one to visualize the appearance and progress of the dual damascene opening in order to effectively optimize the on-going dual damascene process. As the subject dual damascene opening approaches a desired depth, width and/or desired profile, the endpoint of the trench etch process can be determined, thereby eliminating the necessity of employing a trench etch stop layer in the insulating structure.

The dual damascene process may be monitored and optimized in part by a scatterometry system. The concept and principles of scatterometry are described in greater detail below. See FIG. 10. According to one aspect of the present invention, scatterometric data is generated by directing light at the subject wafer and by collecting light reflected from the subject wafer. The reflected light corresponds to a current state of the subject wafer. That is, the light reflected from the wafer directly relates to the depth of an opening and/or profile of the subject wafer. A light detecting device collects the reflected light and/or light data and transmits this information to a trench monitoring system.

The trench monitoring system monitors the dual damascene process by analyzing light data received from the light detectors in accordance with scatterometry techniques and principles. The light data may be transformed or translated into scatterometric data. Scatterometric data typically consists of a signature generated from analysis of the reflected light with respect to the incident light. Therefore, the generated signature corresponds to a current state of the subject wafer at a particular time during the dual damascene process. The generated signature may be compared to a database or signature library composed of any number of known signatures related to wafers which have undergone similar dual damascene processes. When a match is found, the state (i.e., dimensions) of the subject wafer can be determined by the trench monitoring system and fed back into the dual damascene process/system in order to optimize trench formation for the current and future wafers. Wafer dimensions include, for example, the depth, width, and/or profile of the subject wafer as well as other dimensions relating to, affected by, or involved in the dual damascene process. Due to the non-invasive, non-destructive nature of scatterometry, scatterometric data may be gathered at frequent intervals which facilitates sequence analysis of the dual damascene process.

The scatterometric data may also be used by a controller. The controller is operatively coupled to the trench monitoring system. According to one aspect of the present invention, the controller receives information in connection with the subject wafer and/or related data from the trench monitoring system. The controller uses this information to control an etch device which includes one or more dual damascene process components via an etch driving system. Specifically, the etch driving system can serve to translate and implement the controller's instructional commands as well as to process information received from the controller in order to implement such commands. Alternatively, the etch driving system may transmit instructional commands and/or information received from the controller directly to the one or more etch process components. Examples of the one or more etch process components may include at least one of a device, tool, composition, meter or system or a combination thereof which are employed to carry out the trench etch process.

The present invention facilitates controlled feedback of information in order to effect one or more changes in an on-going dual damascene process. For example, according to one aspect of the invention, information fed back to the etch driving system may signal the etch driving system to either continue the trench etch process or to terminate the trench etch process. Termination may occur either immediately or at a determined time. According to another aspect of the invention, the etch driving system may be signaled to adjust one or more trench etch process components according to a determined state of the subject wafer. Such adjustments or modifications to the trench etch process components may be necessary in order to achieve the determined endpoint. A trained neural network or similar device, as later described in FIGS. 3–4 and 9, may be incorporated to facilitate making such optimal modifications to the dual damascene process. For example, the trained neural network may be incorporated into a system for monitoring a dual damascene process and programmed to correlate and/or evaluate dual damascene process parameters, measurements, and other data generated and determined in the course of carrying out the present invention.

It should be appreciated that various aspects of the present invention may employ technologies associated with facilitating unconstrained optimization and/or minimization of error costs associated with the dual damascene process. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks) may be employed in the present invention.

Referring initially to FIG. 1, a high-level schematic illustration of a system 20 for monitoring a dual damascene process is shown. The system 20 includes a wafer 30, wherein the wafer 30 is going to be or is being subjected to a dual damascene/trench etch process. The system 20 also includes a dual damascene process monitoring system 40 operatively coupled to a trench etch chamber/devices (not shown). The trench etch chamber/device performs the trench etch process and includes one or more etch process components 50.

The dual damascene monitoring system 40 may be a stand-alone device and/or may also be distributed between two or more cooperating devices and/or processes. The dual damascene monitoring system 40 may reside in one physical or logical device such as a computer or process and/or be distributed between two or more physical and/or logical devices. The dual damascene monitoring system 40 may include one or more components that are located inside a process chamber and/or one or more components that are not located inside a process chamber. The etch process components 50 may be employed in via and/or trench etch processes depending on the desired application.

The dual damascene monitoring system 40 is operatively coupled to one or more etch process components 50. The one or more etch process components 50 work cooperatively with the dual damascene monitoring system 40. By way of illustration, the one or more etch process components 50 receive and implement instructional commands from the dual damascene monitoring system 40. The dual damascene monitoring system 40 formulates the instructional commands by generating and analyzing data relating to, for example, one or more dimensions of the wafer 30, and in particular, the formation of trenches in the wafer 30.

The dual damascene monitoring system 40 generates this data by directing a beam of incident light 60 at the wafer 30 and collecting a light 70 which is reflected and/or refracted from the wafer 30. The incident light 60 may be supplied by many different light sources, for example, a frequency stabilized laser. The dual damascene monitoring system 40 may direct the light 60 at substantially all of the wafer 30 or at pre-selected regions of the wafer 30. For example, the dual damascene monitoring system 40 may direct the incident light 60 at selected regions of the subject wafer 30 such that these regions provide data sufficient to generate scatterometry signatures. The reflected light 70 is collected by the dual damascene monitoring system 40 and analyzed using scatterometry techniques in order to generate a signature. The generated signature facilitates determining one or more wafer dimensions and/or one or more trench etch process parameters 90 associated with the subject wafer 30.

Wafer dimensions include but are not limited to a thickness and a profile of the subject wafer 30. Trench etch process parameters 90 (not shown) include but are not limited to etchant composition 91, identity of dielectric material 92, etchant flow rate 93, temperature 95, pressure 97, etch rate 96 and (collectively referred to as trench etch process parameters 90).

The dual damascene process monitoring system 40 includes a scatterometry system for analyzing scatterometric data generated by collecting the reflected light 70. Scatterometry analysis may include comparing one or more generated signatures with one or more known signatures contained in a signature library 80. Such signatures may be generated by combining reflected light 70 measurements to produce a signature associated with that reflected light 70 pattern.

As the dual damascene process progresses, signatures associated with the wafer 30 (or layer undergoing the trench etch process) may be generated continuously or at frequent intervals throughout the dual damascene process. For example, light reflected from wafer 30 at time T1 produces a signature S1 which corresponds to a trench depth H1 and/or a wafer profile P1. Similarly, light reflected from the wafer 30 at time T3 produces a signature S3 which corresponds to a trench depth H3 and/or a profile P3. Analyzing the sequence of signatures can facilitate determining whether the wafer 30, or trench, is being etched uniformly and/or whether the wafer 30 is being etched, for example, at the desired speed, width, pressure and/or depth.

Feedback information can be generated from such sequence analysis to maintain, increase or decrease one or more of the trench etch process components in order to modify an on-going trench etch process. For example, information related to the sequence analysis can be fed back to the etch process components 50 where the one or more components 50 may be modified or optimized to effect one or more changes in the on-going dual damascene process. Such modifications may include altering the etchant composition, etching rate and/or pressure in order to determine and/or achieve an appropriate endpoint for the trench etch process.

The dual damascene process monitoring system is operatively coupled to the signature library 80. The signature library 80 may store data in various forms such as, but not limited to, one or more lists, arrays, tables, databases, linked lists and data cubes. The signature library 80 may be located on one or more physical devices such as, for example, disk drives, tape drives, and/or memory units.

Analyses, including sequence analyses, associated with the reflected light 70 and/or known signatures stored in the signature library 80 may be employed to control the one or more etch process components 50. It should be understood that the etch process components 50 may be employed to form a via or trench within the wafer surface in an any manner depending on the desired application.

Figure 2:
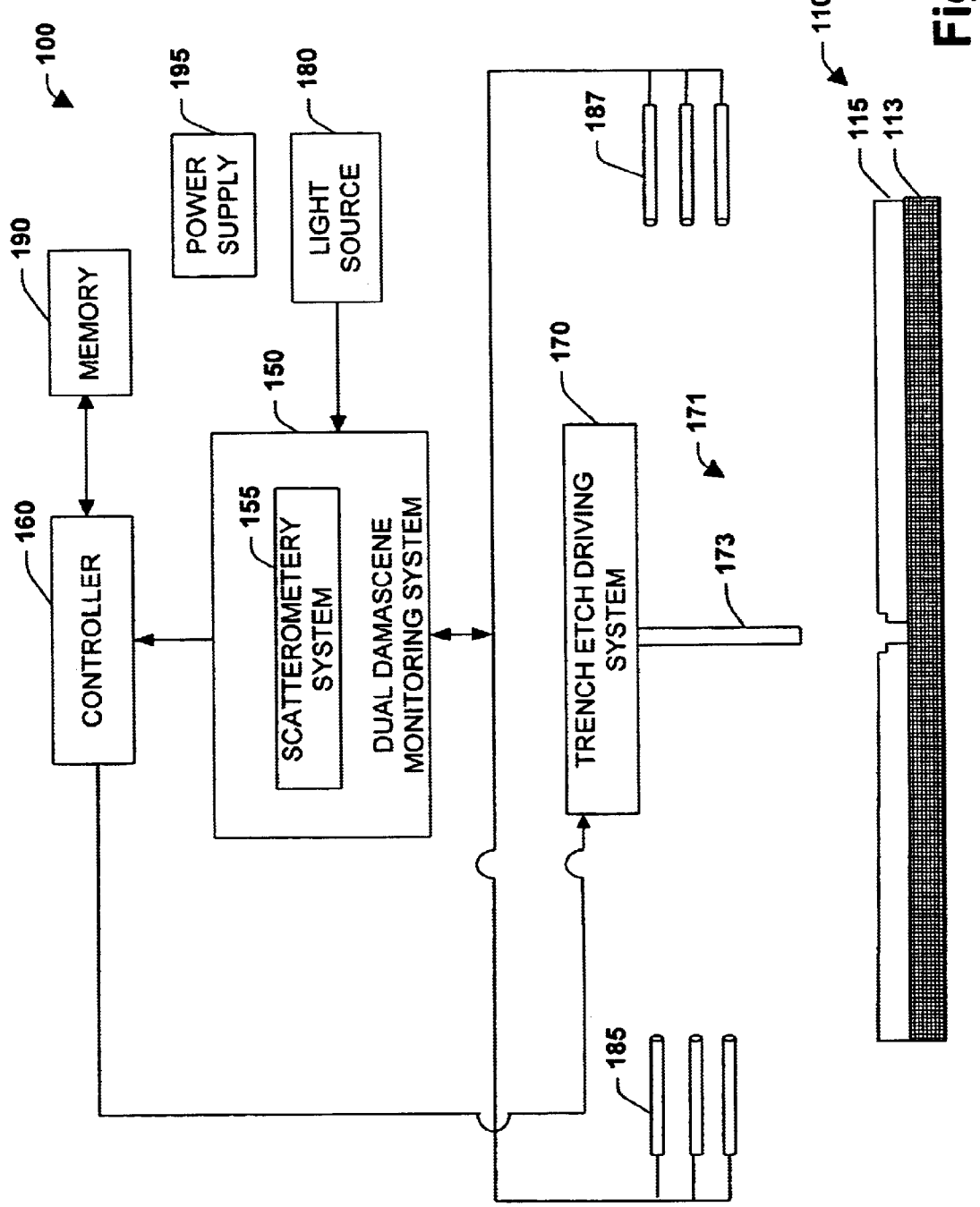
FIG. 2 illustrates a schematic block diagram of a system according to one aspect of the present invention.

Turning now to FIG. 2, a system 100 for monitoring a dual damascene process and determining an endpoint for a trench etch using scatterometry is shown. According to one aspect of the invention, the system 100 possesses controlled-feedback capabilities to implement one or more changes in the dual damascene process for future wafers. According to another aspect, the system 100 is a closed-loop system with controlled feedback capabilities to facilitate optimization of the dual damascene process for a wafer in which a trench is currently being formed and for future wafers.

The system 100 includes a wafer 110 (insulating layer 115 and substrate 113) which is about to undergo or is undergoing a dual damascene process. The system 100 also includes a dual damascene monitoring system 150, a controller 160 and a trench etch driving system 170 which operate cooperatively in order to control an etch device 171 and to facilitate determining an endpoint in the trench etch process. In particular, the dual damascene monitoring system 150 is operatively coupled to the controller 160 which regulates the trench etch driving system 170. The trench etch driving system 170 selectively controls the etch device 171. The etch device 171 performs the trench etch process and includes one or more etch process components such as, for example, an etchant provider 173.

The trench etch driving system 170 receives information and/or instructional commands from the controller 160 based upon its analysis of data transmitted from and collected by the dual damascene monitoring system 150. The controller 160 may include a processor (not shown) for determining the content and type of information to be transmitted to the trench etch driving system 170. For example, the dual damascene monitoring system 150 gathers the reflected light data and performs an analysis of that data using scatterometric techniques or methods. The analyzed data is then transmitted to the controller 160. The controller 160 processes the analyzed data by determining the content and type of information to be transmitted to the trench etch driving system 170. Thus, the controller 160 and/or the driving system 170 may selectively regulate or control the etch device 171 connected to or associated with the trench etch driving system 170.

Moreover, the cooperative interaction between the monitoring system 150, the controller 160 and the driving system 170 facilitates the trench etch process without using an trench etch stop layer in the insulating structure. To that end, trench depth errors may be mitigated and increased efficiency in semiconductor fabrication achieved.

Still referring to FIG. 2, the components associated with the system 100 are now described in greater detail. The dual damascene monitoring system 150 is operatively connected to one or more target light sources 185 and one or more light detectors 187. The target light source 185 projects light onto the wafer 110, which is about to be or is being subjected to the dual damascene/trench etch process. The light may be one or more beams of light such as a laser; however, other types of light suitable to carry out the present invention may be employed. The light may be projected onto the entire surface of the wafer 110 or at selected regions of the wafer 110 surface. The light reflected from the wafer 110 is collected by the one or more light detectors 187. It should be appreciated that the light may also refract from the wafer 110 surface.

The dual damascene monitoring system 150 analyzes the collected light data using a scatterometry system 155 and generates a signature. Analysis of the collected light involves determining at least one dimension related to the subject wafer 110 according to scatterometric principles. For example, a depth, width, and/or a profile of the insulating layer 115 (and openings therein) can be measured and compared to a desired depth, width, and/or desired profile. The reflected light is measured with respect to the incident light in order to obtain the various dimensions relating to the subject insulation layer 115.

It should be appreciated that any suitable scatterometry system 155 may be employed to carry out the present invention. Furthermore, such systems are contemplated to fall within the scope of the claimed invention.

The system 100 also includes a light source 180 which supplies light to the target light sources 185 through or via the dual damascene monitoring system 150. The light source 180 may be a frequency-stabilized laser; however it should be understood that any laser or other light source suitable for carrying out the present invention may be employed. Other examples include a laser diode or a helium neon gas laser.

The collected light data may also be further analyzed by the controller 160. The controller 160 is operatively coupled to the trench etch driving system 170. Therefore, the trench etch driving system 170 is at least in part regulated by the controller 160. The trench etch driving system 170 selectively controls the etch device 171, as well as the one or more trench etch process components, at least in part according to the information received from the controller 160. The controller 160 can determine the progress of the trench etch process as well as the most current state of the insulating layer 115.

According to one aspect of the present invention, the controller 160 can process the measured depth $H_m$ to determine an appropriate endpoint for the current trench etch process. For example, the measured depth may be compared to stored signatures. Each stored signature may include a set of trench etch process parameters which if implemented, facilitates determining a termination or endpoint. When a match is found, the set of trench etch process parameters may be analyzed by the controller 160 and implemented by the trench ertch driving system 170 to achieve an appropriate endpoint for the current trench etch process. The controller 160 may transmit all or part of the set of trench etch process parameters to the trench etch driving system 170 depending on the current trench etch process parameters.

Hence, the controller 160 selectively regulates the one or more trench etch process components via the trench etch driving system 170 in order to determine a termination point of the on-going dual damascene process.

As described above, the controller 160 may include a processor (not shown). Such processor, or central processing unit, may be any of a plurality of processors, such as the AMD K7, the AMD Athlon™, the AMD Duron™, and other similar and/or compatible processing units. The controller 160/processor may be programmed to control and operate the various components within the system 100 in order to carry out the various functions described herein.

The controller 160 may also be operatively coupled to a memory 190. The memory 190 serves to store information such as, for example, program code executed by the controller 160 for carrying out operating functions of the system 100 as described herein. By way of illustration, the memory 190 can hold patterns or signatures or other data to which observed (measured) data can be compared. The memory 190 also serves as a storage medium for temporarily storing trench etch process parameters and measured wafer and/or layer dimensions such as trench etch process progress values, trench etch process progress tables, component coordinate tables, wafer and/or layer shapes and sizes, scatterometry information, achieved wafer and/or layer dimensions, desired wafer and/or layer dimensions as well as other data that may be employed to facilitate the performance of the present invention.

The system 100 is powered by a power supply 195. Such power supply 195 may be any suitable power supply, such as a battery and/or line power, necessary to carry out the present invention.

Figure 3:
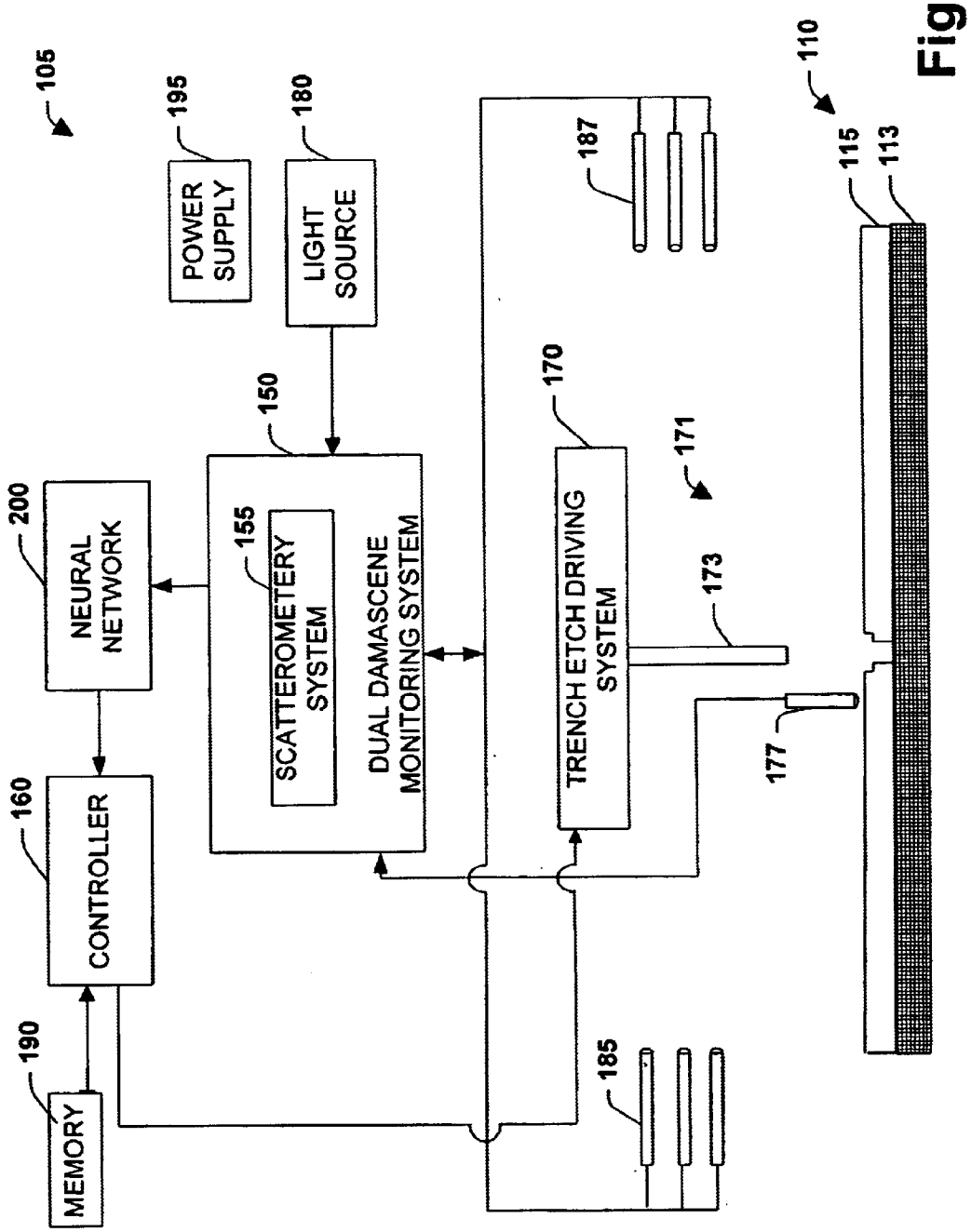
FIG. 3 illustrates a schematic block diagram of a system including a neural network according to one aspect of the present invention.

Referring now to FIG. 3, a dual damascene monitoring, optimization and endpoint determination system 105 is shown which is similar to the system 100. The dual damascene monitoring and endpoint determination system 100 described in FIG. 2 may also include a trained neural network (TNN) 200 for detecting and diagnosing problems within the one or more trench etch process parameters 90 associated with the collected light data and generated signature. The TNN 200 can determine the necessary adjustments to be made to the one or more trench etch process parameters 90 by evaluating the parameters 90 as they existed at the time the light data was detected and collected. Operation of the FNN 200 is illustrated in FIG. 4.

Figure 4:
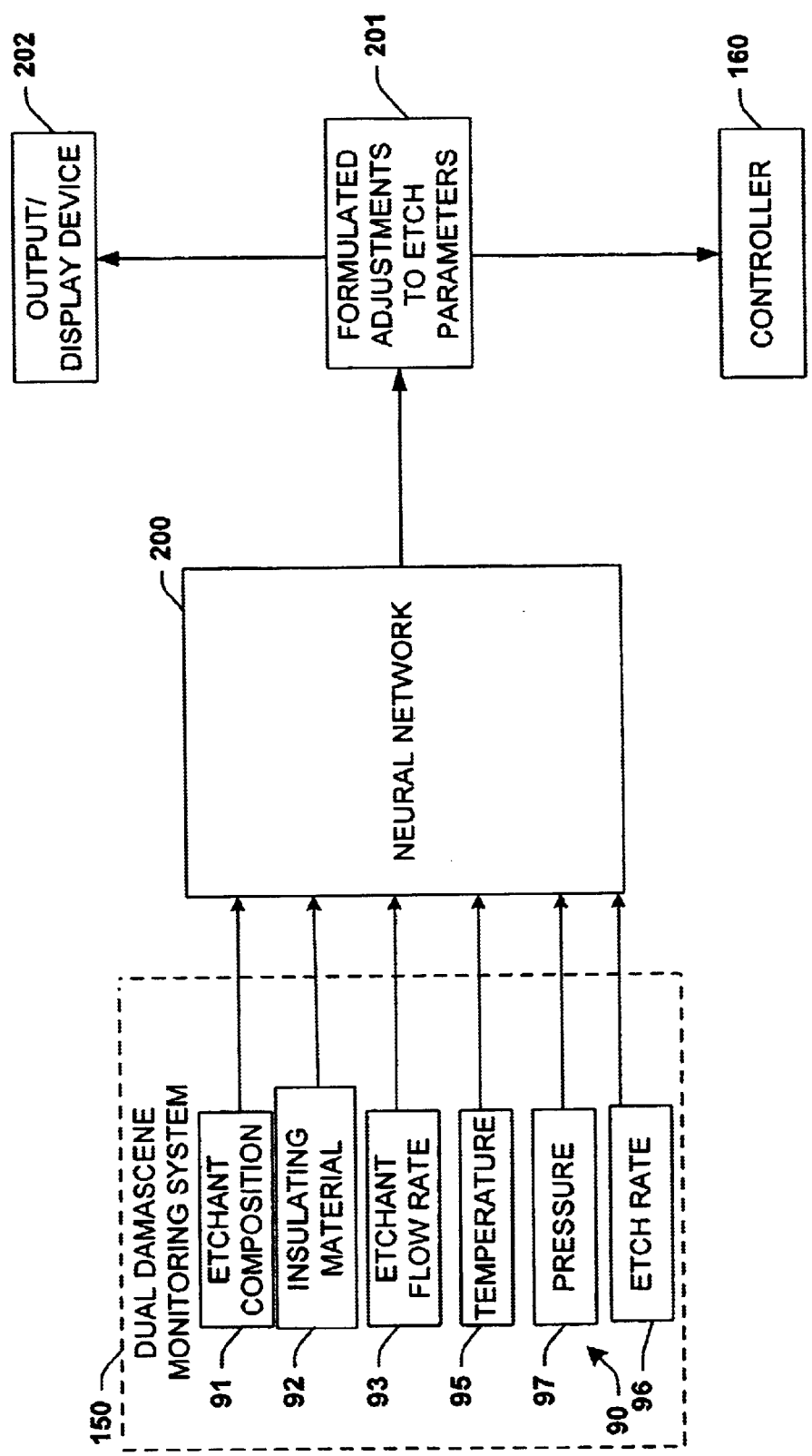
FIG. 4 illustrates a high-level schematic diagram of a neural network employed in the system of FIG. 3 according to one aspect of the present invention.

As can be seen in FIG. 4, the TNN 200 may receive input data from the dual damascene monitoring system 150 such as, for example, trench etch process parameters 90 and/or the corresponding generated signature. Examples of trench etch process parameters include identity of etchant composition 91, identity of insulating material 92, etchant flow rate 93, temperature 95, pressure 97, and etch rate 96. The TNN 200 processes the parameter and/or signature information or data and outputs a listing 201 including one or more adjustments to make to the one or more trench etch process parameters 90. The listing 201 may then be transmitted to the controller 160 for implementation. The controller 160 may translate the listing information into informational commands and then may transmit those commands to the trench etch driving system 170, as described in FIG. 2. Alternatively or in addition, the listing 201 may then be transmitted to an output/display device 202 for operator evaluation.

The TNN 200 may also function to detect parameter-adjustment implementation errors (not shown in FIG. 4). That is, the TNN 200 may be programmed to remember past listings 201 of adjustments made to the one or more trench etch process parameters 90. Therefore, if the TNN 200 receives input data (e.g., trench etch process parameters 90) that does not reflect an adjustment which was previously commanded, then the TNN 200 outputs an error signal corresponding to the particular parameter. For example, at time $T_5$, the TNN 200 receives input data relating to generated signature S, and the corresponding process parameters 91, 92, 93, 95 and 97. According to the generated signature $S_5$ and the process parameters, TNN 200 determines that the identity of the insulating material and the etchant flow rate 93 require downward adjustments which are specific to each parameter. Information relating to these adjustments are transmitted to the controller 160 and then to the trench etch driving system 170 for effective implementation. However, at time $T_6$, the input data associated with the etchant flow rate 93 indicates that the previous adjustment was not properly implemented (i.e., etchant flow rate 93 increased indicating an upward adjustment).

The generated error signal indicates the solution flow rate and alerts the system 105 and/or an operator via the output/display device 202 of the error and its source (e.g., etchant flow rate). The TNN 200 may also be programmed to indicate the extent to which one or more trench etch process parameters 90 have deviated from the prescribed adjustment(s). For example, the solution flow rate at time $T_6$ increased 1.5 times from its reading at time $T_5$. Thus, the TNN 200 has the capabilities to facilitate optimization of the trench etch process by prescribing trench etch process parameter adjustments and further by detecting internal adjustment implementation errors.

FIGS. 5–8 are described in detail below with respect to the dual damascene monitoring and endpoint determination system 100. However, it should be understood that the present invention contemplates that the system 105 may also be employed.

Figure 5:
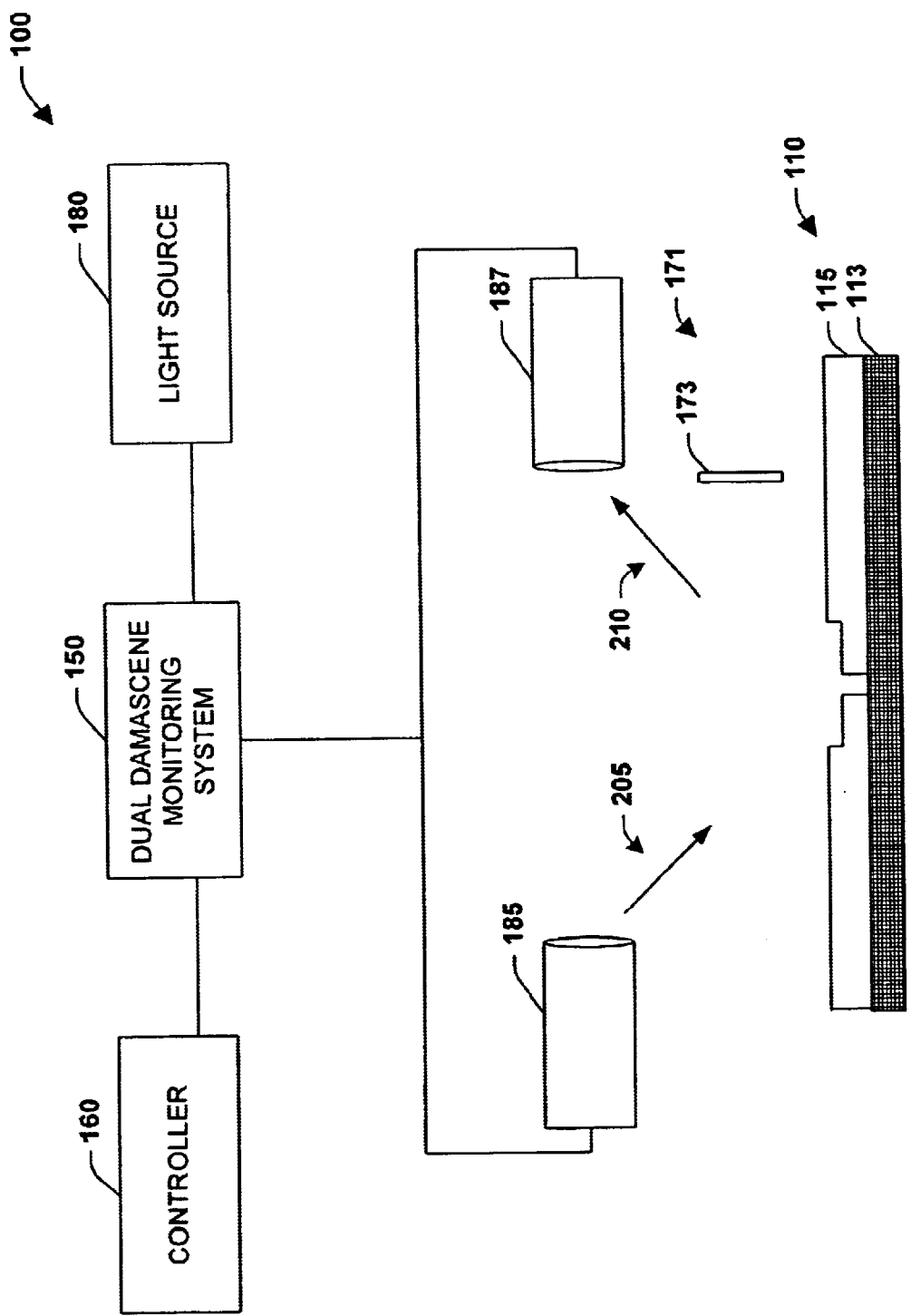
FIG. 5 illustrates a schematic., partial block diagram of a system employed in a dual damascene process according to one aspect of the present invention.

Turning now to FIG. 5, one aspect of the system 100 in use is shown. FIG. 5 illustrates the system 100 being employed to monitor a dual damascene process in order to determine a trench etch endpoint. As shown, the wafer 110 (top insulating layer 115 and substrate 113) is undergoing a trench etch process; however, it should be appreciated that the system 100 may operate on any wafer structure which is about to undergo such a process. On the surface of the wafer 110, an etchant is applied in a manner and in amount depending on the desired application. The etch device 171 components such as, for example, the etchant provider 173 are positioned to begin the trench etch process. Before and/or during the trench etch process, the dual damascene monitoring system 150 may be employed. The target light source 185 projects one or more beams of light 205 onto the insulating layer 115 (top surface of wafer 110). Reflected light 210 is detected by the one or more light detectors 187 and collected by the dual damascene monitoring system 150 according to scaflerometry techniques.

The dual damascene monitoring system 150 analyzes the collected light and/or related data and generates a signature using scatterometry techniques. Analysis of the collected light and/or related data may involve comparing the collected light data to stored light data to determine a state of the layer 115 (at the time the light was projected 205 and reflected 210 from the layer 115). Determining the state of the layer 115 includes determining layer dimensions such as a depth of a trench, width of a trench, depth of a via, and a profile of the insulating layer 115 for either the whole length of the layer 115 or selected portions of the layer 115 . The generated signature and/or related data are transmitted to the controller 160 where it is processed into information and instructional commands in a form usable to the trench etch driving system (FIG. 2). Processing performed by the controller 160 may also involve comparing the measured trench etch processing parameters to known trench etch processing parameters in order to determine a proper endpoint for the current trench etch process.

The dual damascene monitoring system 150 provides to the controller 160 direct, real-time measurements and observations related to the current state of the insulating layer 115 as the trench etch process progresses. Providing real-time, direct measurements to the controller 160 and to the trench etch driving system (FIG. 2) facilitates a more precise determination of a trench etch process endpoint over conventional endpoint detection systems and methods.

Figure 6:
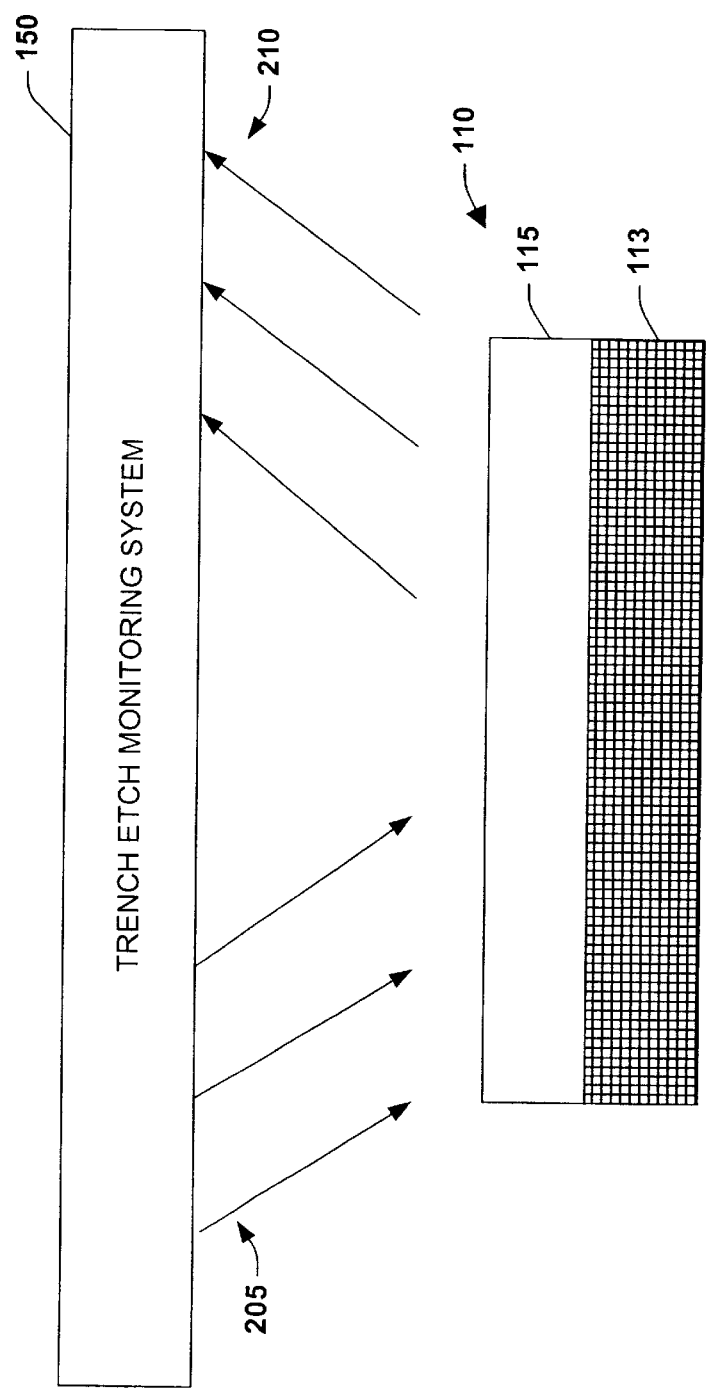
FIG. 6 illustrates a cross-sectional diagram of a wafer undergoing a dual damascene process according to one aspect of the present invention.
Figure 7:
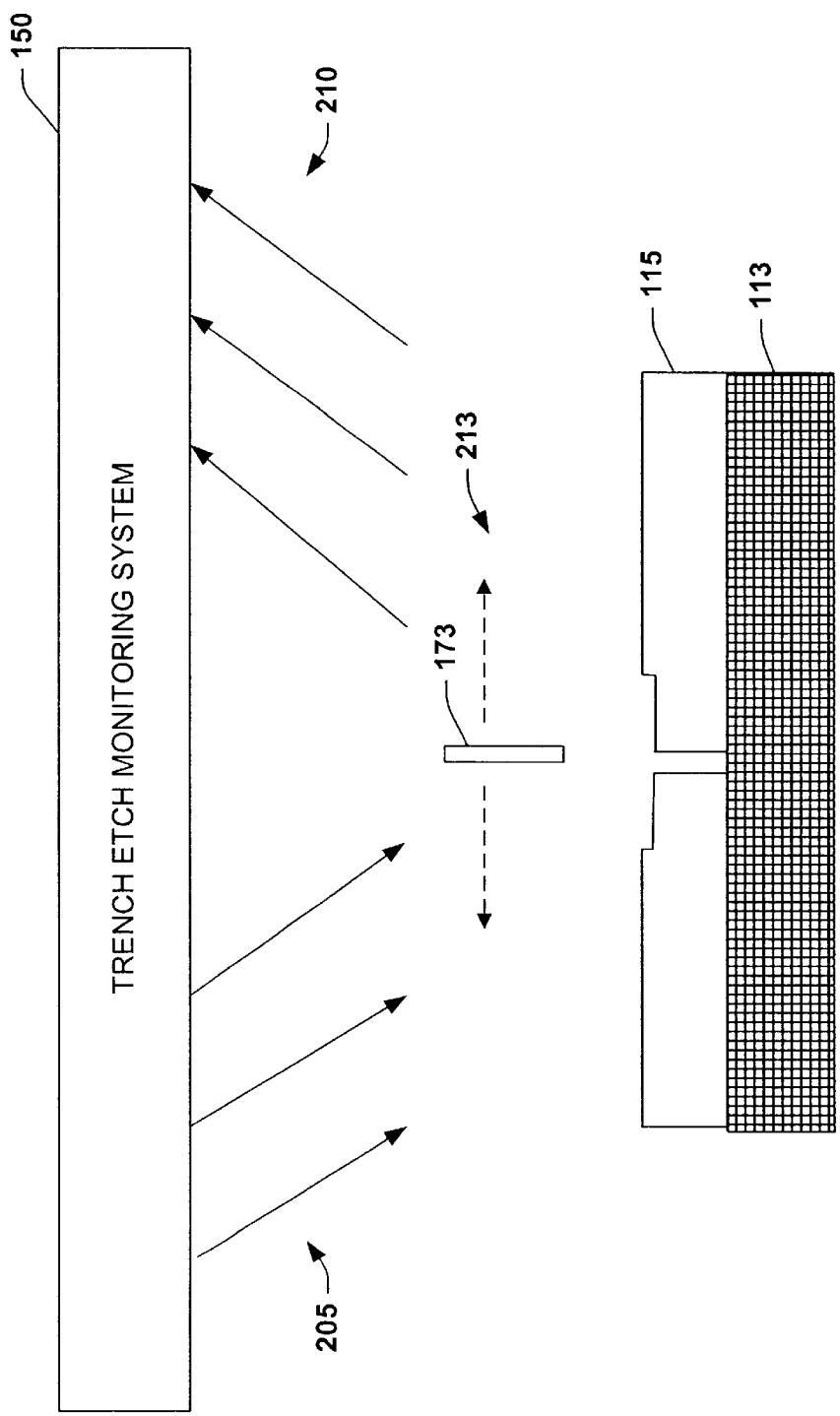
FIG. 7 illustrates a cross-sectional diagram of a wafer undergoing a dual damascene process according to one aspect of the present invention.
Figure 8:
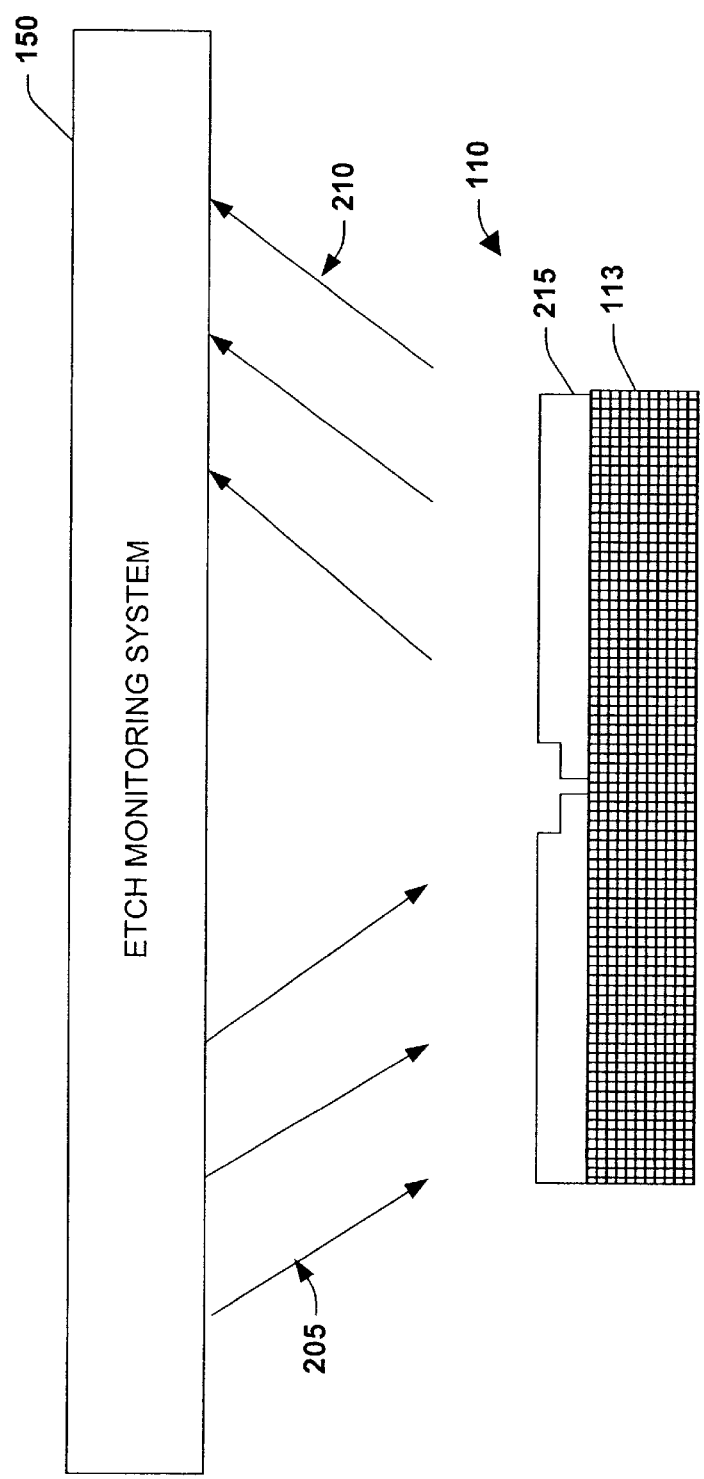
FIG. 8 illustrates a cross-sectional diagram of a wafer undergoing a dual damascene process according to one aspect of the present invention.

FIGS. 6–8 illustrate the trench etch process monitoring system 150 being employed in a trench etch process from the time before the process begins ($T_0$) to the time the process ends ($T_E$). In FIG. 6, the incident light 205 is directed at the wafer 110 (i.e., layer 115). The entire length and/or selected portions of the wafer 110 may be monitored and measured in order to determine the progress of the trench etch process and a trench etch process endpoint. The incident light 205 may be projected onto the wafer 110 at simultaneous, multiple beams of light 205 at a fixed angle in order to obtain these measurements. The monitoring system 150 then collects the light 210 which reflects off of the wafer 110 (insulating layer 115). It should be appreciated that one or more beams of incident light 205 may be employed and one or more beams of reflected light may be collected to carry out the present invention.

Measurements taken at $T_0$ may be used to ascertain the initial state (e.g., depth and profile) of the wafer 110 just prior to etching. Measurements corresponding to the initial dimensions of the wafer 110 may also be used to determine the extent or degree of etching that has occurred at some later time ($T_n$) during the trench etch process. Furthermore, comparing the state of the layer at $T_0$ and $T_n$ may facilitate determining an endpoint for the trench etch process.

In FIG. 7, the trench etch monitoring system 150 is being employed to monitor the wafer 110, and in particular layer 115, while a trench etch process 213 is in progress. The etchant provider 173 and other trench etch process components move across the insulating layer 115 applying etchant. As the trench etch process components move across the insulating layer 115, the trench etch monitoring system 150 continually projects the light 205, collects the reflected light 210 and analyzes the collected light data in order to determine an endpoint of the trench etch process 213. In particular, as the process 213 progresses, the trench etch monitoring system 150 is able to gather real-time information relating to the layer being polished and controllably feed that information back to the trench etch driving system (and trench etch process components) via the controller 160 (FIG. 2). Thus, the trench etch monitoring system 150 facilitates determining a trench etch process endpoint with increased precision and control and without the need for a trench etch stop layer in the insulating layer 115.

FIG. 8 shows the wafer 110 following completion of the trench etch process 213 (FIG. 7). As can be seen, the wafer 110 now has an insulating layer 215 with a dual damascene opening therein. The trench etch monitoring system 150 may continue to operate as described above at the completion of the trench etch process 213 to verify the accuracy of the system-determined endpoint.

Figure 9:
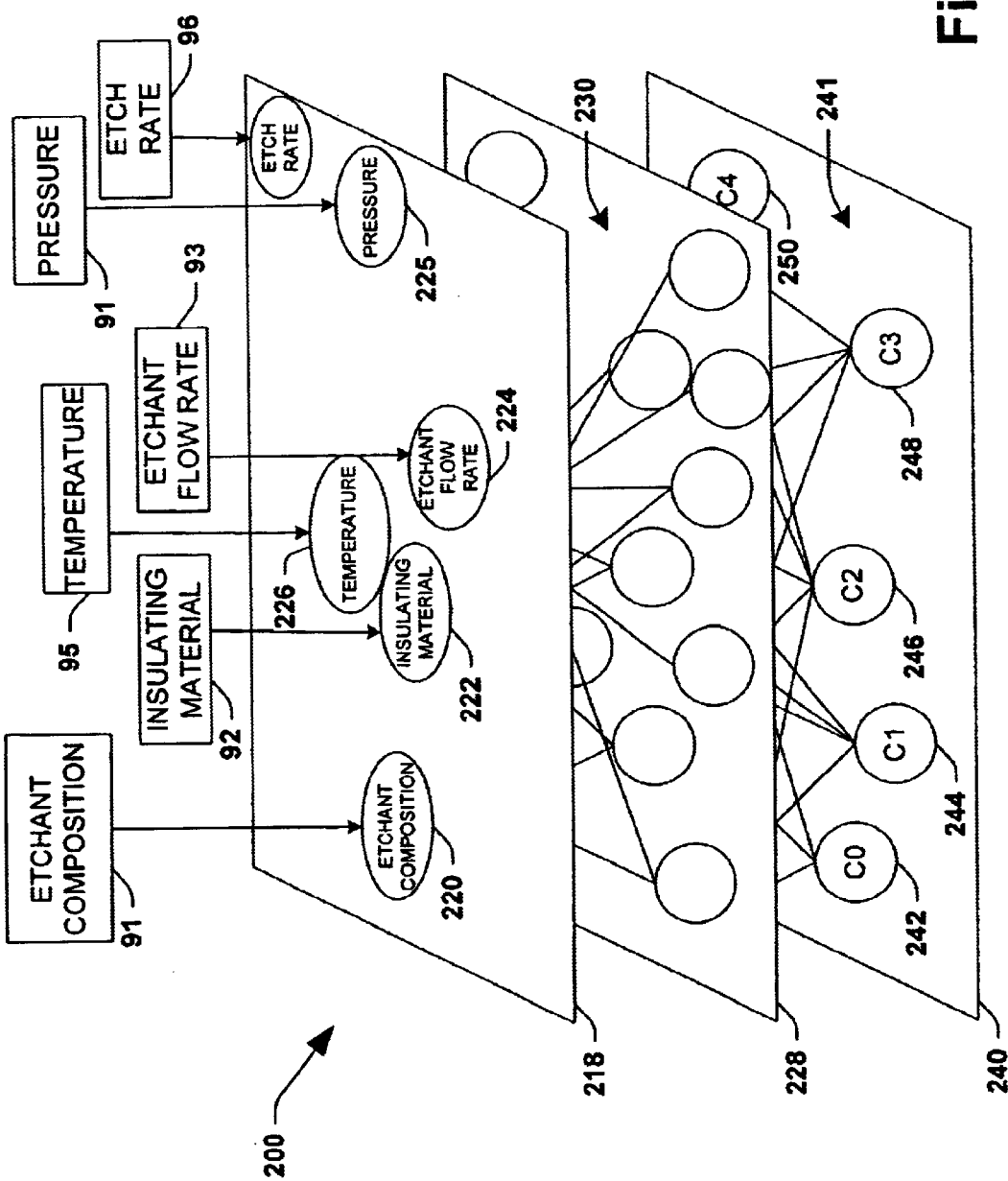
FIG. 9 illustrates a schematic diagram of an exemplary neural network according to one aspect of the present invention.

Referring now to FIG. 9, the exemplary neural network 200 comprises an input layer 218 having neurons 220, 222, 224, 225, and 226 corresponding to the identity of the etchant composition, identity of the insulating material, etchant flow rate, pressure, temperature, and etch rate, respectively, received from sensors or detecting devices (not shown) of the trench etch monitoring system 150. One or more intermediate or hidden layers 228 are provided in the network 200, wherein any number of hidden layer neurons 230 may be provided therein. The neural network 200 further comprises an output layer 240 having a plurality of output neurons corresponding to pre-determined trench etch/ process parameter classification values of the class 241. Thus, for example, the output layer 240 may comprise output neurons 242, 244, 246, 248, and 250 corresponding to class values 0, 1, 2, 3, and 4, respectively, whereby the neural network 200 may output an adjustment listing 201 indicative of necessary adjustments to the one or more trench etch process parameters 90 as well as to the existence and extent of adjustment implementation errors in the monitoring system (e.g., system 105) with which it is associated.

In this regard, the number, type, and configuration of the neurons in the hidden layer(s) 228 may be determined according to design principles known in the art for establishing neural networks. For instance, the number of neurons in the input and output layers 218 and 240, respectively, may be selected according to the number of attributes (e.g., pressures, flow, etch rate, etc.) associated with the system 105, and the number of parameter classes 241. In addition, the number of layers, the number of component neurons thereof, the types of connections among neurons for different layers as well as among neurons within a layer, the manner in which neurons in the network 200 receive inputs and produce outputs, as well as the connection strengths between neurons may be determined according to a given application (e.g. trench etch monitoring system) or according to other design considerations.

Accordingly, the invention contemplates neural networks having many hierarchical structures including those illustrated with respect to the exemplary network 200 of FIG. 9, as well as others not illustrated, such as resonance structures. In addition, the inter-layer connections of the network 200 may comprise fully connected, partially connected, feed-forward, bi-directional, recurrent, and off-center or off surround interconnections. The exemplary neural network 200, moreover, may be trained according to a variety of techniques, including but not limited to back propagation, unsupervised learning, and reinforcement learning, wherein the learning may be performed on-line and/or off-line. For instance, where transitions between classes are continuous and differences between classes of process parameters are slight, it may be difficult to use unsupervised learning for the purpose of adjustment implementation error detection, in which case supervised learning may be preferred, which may advantageously employ back propagation. In this regard, training of the classifier may be done on a sufficient amount of training data covering many trench etch process parameter degrees (e.g., severities) and operating conditions of the monitoring system. Furthermore, the training of the network 200 may be accomplished according to any appropriate training laws or rules, including but not limited to Hebb's Rule, Hopfield Law, Delta Rule, Kohonen's Learning Law, and/or the like, in accordance with the present invention.

Figure 10:
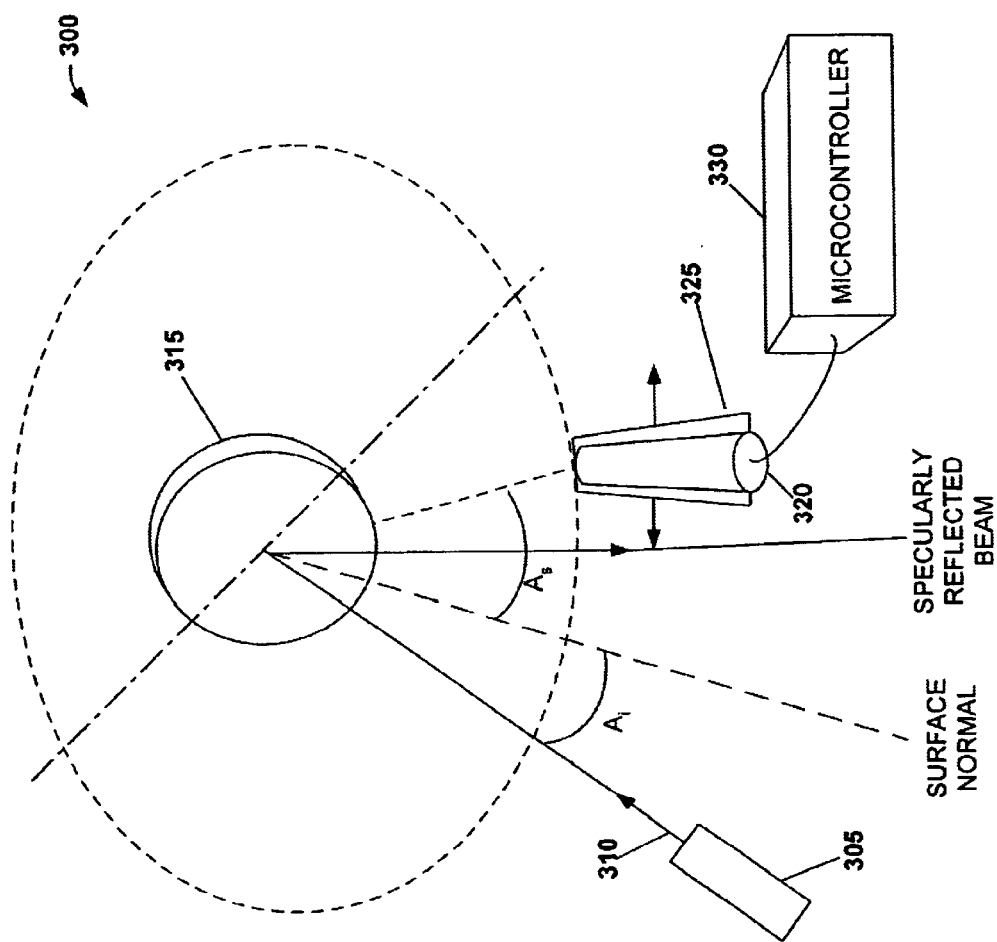
FIG. 10 illustrates a schematic diagram of an exemplary scatterometry system according to one aspect of the present invention.
Figure 11:
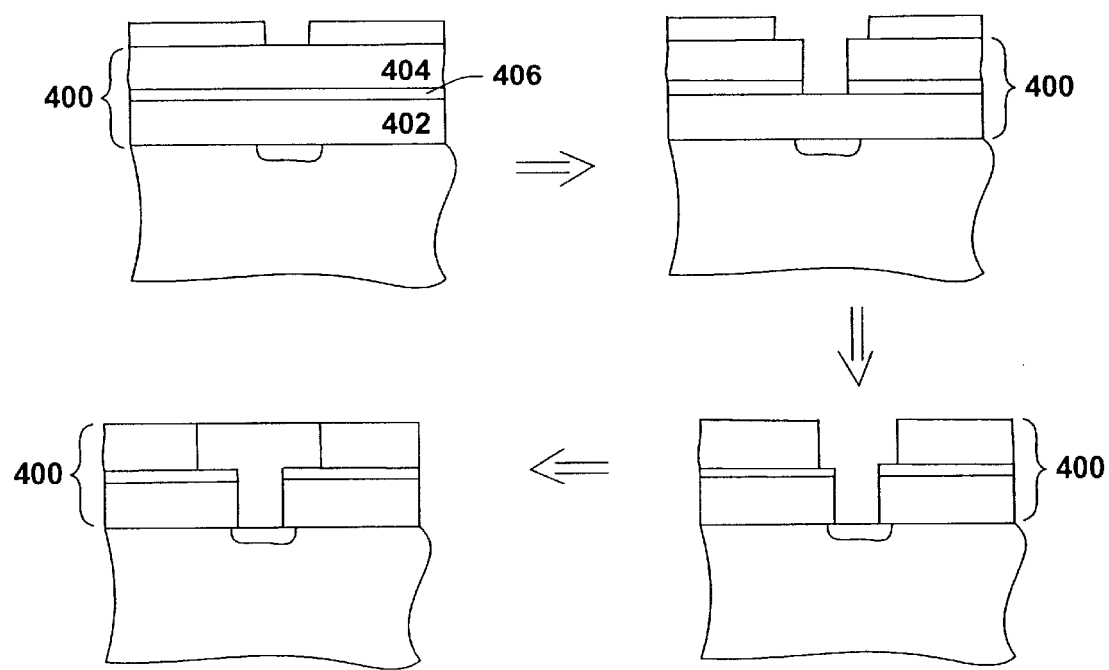
FIG. 11 illustrates a prior art dual damascene process.
Figure 12:
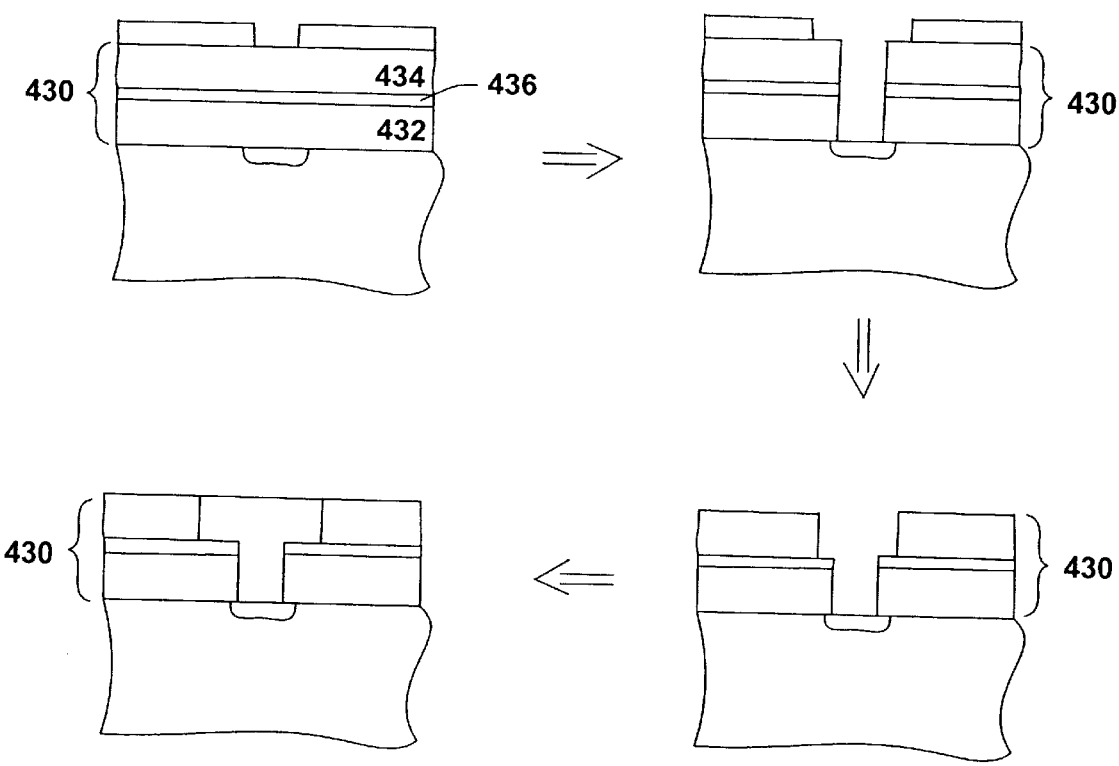
FIG. 12 illustrates a prior art dual damascene process.
Figure 13:
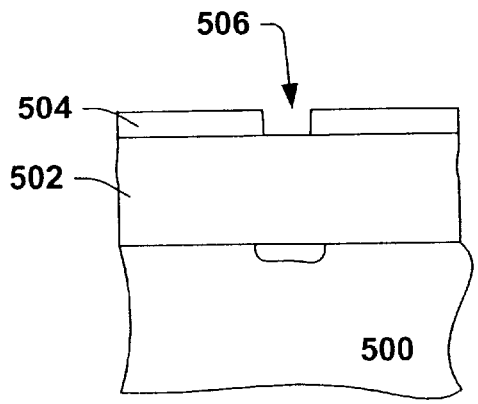
FIGS. 13–16 illustrate a dual damascene process according to one aspect of the present invention.

FIG. 10 illustrates an exemplary scatterometry system 300 collecting reflected light. Light from a laser 305 is brought to focus in any suitable known manner to form a beam 310. A sample, such as a wafer 315, is placed in the path of the beam 310 and a photo detector or photo multiplier 320 of any suitable known construction. Different detector methods may be employed to determine the scattered power. To obtain a grating pitch, the photo detector or photo multiplier 320 may be mounted on a rotation stage 325 of any suitable known design. A micro-controller 330, of any suitable known design, may be used to process detector readouts, including, but not limited to, angular locations of different diffracted orders leading to diffraction grating pitches being calculated. Thus, light reflected from the sample 315 may be accurately measured.

Scatterometry is a technique for extracting information about a surface upon which an incident light has been directed. Scatterometry is a metrology that relates the geometry of a sample to its scattering effects. Scatterometry is based on the reconstruction of the grating profile from its optical diffraction responses. Information concerning properties including, but not limited to, depth, width, erosion, profile, thickness of dual damascene openings/trenches and critical dimensions of features present on the surface can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the trenches in the surface, the planarity of the surface, features on the surface, voids in the surface, and the depth of openings in the surface. In the present invention, the intensity and/or phase of the reflected and/or diffracted light will be examined as it relates to critical dimensions desired on the wafer being etched.

Different combinations of the above-mentioned properties will have different effects on the phase and/or intensity of the incident light resulting in substantially unique intensity/phase signatures in the complex reflected and/or diffracted light. Thus, by examining a signal (signature or stored value) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk, \text{ where } j \text{ is an imaginary number.}$$

The signature library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a trench of a first depth may generate a first signature while a trench of a second depth may generate a second signature. Observed signatures can be combined with simulated and modeled signatures to form the signature library. Simulation and modeling can be employed to produce signatures against which measured phase/intensity signatures can be matched.

In one exemplary aspect of the present invention, simulation, modeling and observed signatures are stored in a signature library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of dual damascene processing, comprising:
   providing a semiconductor substrate with an insulation structure on an upper surface thereof, the insulation structure consisting essentially of a single layer of a dielectric material;
   forming a plurality of via openings in the insulation structure, wherein groups of via openings are positioned in a substantially straight line;
   simultaneously
     (i) forming a plurality of trenches in the insulation structure, each trench positioned along the substantially straight line of a group of via openings, and
     (ii) monitoring the formation of trenches using a scatterometry system by generating a signature associated with forming the trenches, comparing the signature to a signature library to determine trench depth, and terminating forming the trenches when a desired trench depth is attained; and
   filling the trenches and via openings with a conductive metal.

2. The method of claim 1, wherein generating the signature associated with forming the trenches comprises directing a beam of incident light at the insulation structure, collecting light reflected from the insulation structure, and transforming the reflected light into the signature.

3. The method of claim 1, wherein the signature associated with forming the trenches corresponds to a particular depth and profile associated with an upper surface of the insulation structure as it appears before, during and after forming the trenches.

4. The method of claim 1, wherein an analysis system compares the signature to a signature library to determine trench depth.

5. The method of claim 1, wherein a closed loop feedback control system for terminating the formation of the trenches according to the determined trench depth comprises feeding information related to trench depth via the closed loop feedback control system to a trench etch controller, wherein the trench etch controller is connected to a trained neural network to facilitate termination of the formation of trenches.

6. The method of claim 1, wherein the scatterometry system further compares the signature to a signature library to determine trench profile, and terminates forming the trenches when a desired trench profile is attained.

7. The method of claim 1, wherein an analysis system compares the signature to a signature library to determine trench depth and via depth.

8. The method of claim 1, wherein the dielectric material comprises one selected from the group consisting of silicon dioxide, silicon nitride, silicon oxynitride, fluorine doped silicon glass, tetraethylorthosilicate, borophosphotetraethylorthosilicate, phosphosilicate glass, borophosphosilicate glass, polyimides, fluorinated polyimides, polysilsequioxane, benzocyclobutene, poly (arylene ester), parylene F, parylene N and amorphous polytetrafluoroethylene.

9. A method of forming a dual damascene opening in a semiconductor substrate, comprising:

providing a semiconductor substrate with an insulation structure on an upper surface thereof, the insulation structure consisting essentially of a single layer of a dielectric material;

forming at least one via opening in the insulation structure; and simultaneously (i) forming a trench in the insulation structure, the trench positioned above the via opening, both the via opening and the trench constituting the dual damascene opening, and (ii) monitoring forming the trench using a scatterometry system by:

directing a beam of incident light at the insulation structure, collecting light reflected from the insulation structure, transforming the reflected light into a signature associated with forming the trench, comparing the signature to a signature library to determine trench depth, and terminating forming the trench when a desired trench depth is attained.

10. The method of claim 9, wherein the dielectric material comprises one selected from the group consisting of silicon dioxide, silicon nitride, silicon oxynitride, fluorine doped silicon glass, tetraethylorthosilicate, borophosphotetraethylorthosilicate, phosphosilicate glass, borophosphosilicate glass, polyimides, fluorinated polyimides, polysilsequioxane, benzocyclobutene, poly (arylene ester), parylene F, parylene N and amorphous polytetrafluoroethylene.

11. The method of claim 9, wherein the signature associated with forming the trench corresponds to a particular depth and profile associated with an upper surface of the insulation structure as it appears before, during and after forming the trench.

12. The method of claim 9, wherein an analysis system compares the signature to a signature library to determine trench depth.

13. The method of claim 9, wherein a closed loop feedback control system for terminating the formation of the trench according to the determined trench depth comprises feeding information related to trench depth via the closed loop feedback control system to a trench etch controller, wherein the trench etch controller is connected to a trained neural network to facilitate termination of the formation of trench.

14. The method of claim 9, wherein the scatterometry system further compares the signature to a signature library to determine trench profile, and terminates forming the trenches when a desired trench profile is attained.

15. The method of claim 9, wherein an analysis system compares the signature to a signature library to determine trench depth and via depth.

16. A method of forming a dual damascene structure, comprising:

providing a semiconductor substrate with an insulation structure on an upper surface thereof, the insulation structure consisting essentially of a single layer of a dielectric material;

forming a plurality of via openings in the insulation structure, wherein groups of via openings are positioned in a substantially straight line;

simultaneously (i) forming a plurality of trenches in the insulation structure using a trench etch controller, each trench positioned along the substantially straight line of a group of via openings, and (ii) monitoring the formation of trenches using a scatterometry system by generating a signature associated with forming the trenches, comparing the signature to a signature library to determine trench depth, and if the determine trench depth is not within an acceptable range of desired trench depths, instructing the trench etch controller to continue forming the trenches and optionally adjust a trench etch process component;

if the determine trench depth is within an acceptable range of desired trench depths, instructing the trench etch controller to terminate forming the trenches; and filling the trenches and via openings with a conductive metal.

17. The method of claim 16, wherein the dielectric material comprises one selected from the group consisting of silicon dioxide, silicon nitride, silicon oxynitride, fluorine doped silicon glass, tetraethylorthosilicate, borophosphotetraethylorthosilicate, phosphosilicate glass, borophosphosilicate glass, polyimides, fluorinated polyimides, polysilsequioxane, benzocyclobutene, poly (arylene ester), parylene F, parylene N and amorphous polytetrafluoroethylene.

18. The method of claim 16, wherein the trench etch controller and a trained neural network facilitate determining if the trench depth is within an acceptable range of desired trench depths.

19. The method of claim 16, wherein generating the signature associated with forming the trenches comprises directing a beam of incident light at the insulation structure, collecting light reflected from the insulation structure, and transforming the reflected light into the signature.

20. The method of claim 16, wherein the signature associated with forming the trenches corresponds to a particular depth and profile associated with an upper surface of the insulation structure as it appears before, during and after forming the trenches.

* * * * *